United States Patent
Hu et al.

(10) Patent No.: US 7,851,800 B2
(45) Date of Patent: Dec. 14, 2010

(54) THIN FILM TRANSISTOR AND ORGANIC ELECTRO-LUMINESCENT DISPLAY DEVICE

(75) Inventors: Tarng-Shiang Hu, Hsinchu (TW); Yi-Kai Wang, Hsinchu (TW); Jing-Yi Yan, Taoyuan (TW); Tsung-Hsien Lin, Hsinchu (TW); Jia-Chong Ho, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/345,666

(22) Filed: Dec. 30, 2008

(65) Prior Publication Data

US 2009/0102375 A1    Apr. 23, 2009

Related U.S. Application Data

(62) Division of application No. 11/309,735, filed on Sep. 19, 2006.

(30) Foreign Application Priority Data

Jan. 11, 2006   (TW) ............................. 95101041 A

(51) Int. Cl.
H01L 31/00    (2006.01)
(52) U.S. Cl. ........................................ 257/59; 438/149

(58) Field of Classification Search .................. 257/49, 257/59
See application file for complete search history.

(56) References Cited

U.S. PATENT DOCUMENTS

| | | | | |
|---|---|---|---|---|
| 2001/0019374 A1* | 9/2001 | Izumi et al. | ................... | 349/43 |
| 2001/0038367 A1* | 11/2001 | Inukai | .......................... | 345/76 |
| 2002/0109796 A1* | 8/2002 | Lin et al. | ....................... | 349/43 |
| 2005/0269562 A1* | 12/2005 | Yang et al. | .................... | 257/40 |
| 2006/0192487 A1* | 8/2006 | Choi et al. | ................... | 313/512 |

* cited by examiner

Primary Examiner—Thao X Le
Assistant Examiner—Kimberly Trice
(74) Attorney, Agent, or Firm—Jianq Chyun IP Office

(57) ABSTRACT

A TFT and an OLED device are provided. The TFT includes a substrate, a gate, a gate insulator, a source/drain layer, an isolated layer, and a channel layer. The gate is disposed on the substrate. The gate insulator is disposed on the substrate and covers the gate. The source/drain layer is disposed on the gate insulator, and exposes a portion of the gate insulator above the gate. The isolated layer is disposed on the source/drain layer and has an opening to expose a portion of the gate insulator and a portion of the source/drain layer above the gate. The channel layer is disposed in the opening of the isolated layer. Further, the channel layer is exposed by the opening and is electrically connected to the source/drain layer. On the other hand, the OLED device mainly includes a driving circuit and an organic electro-luminescent unit.

16 Claims, 8 Drawing Sheets

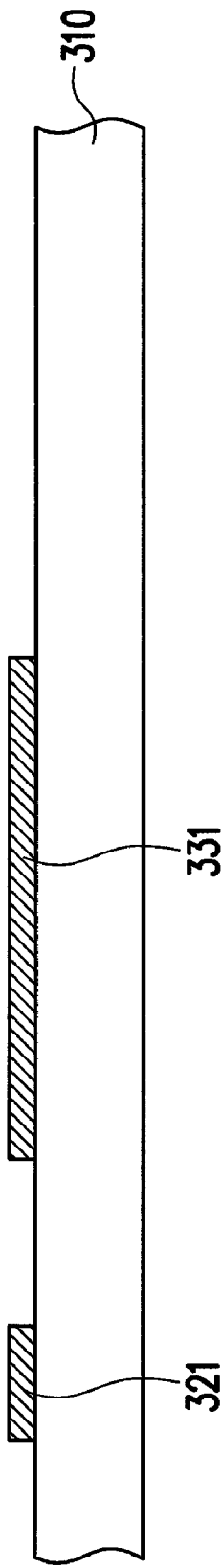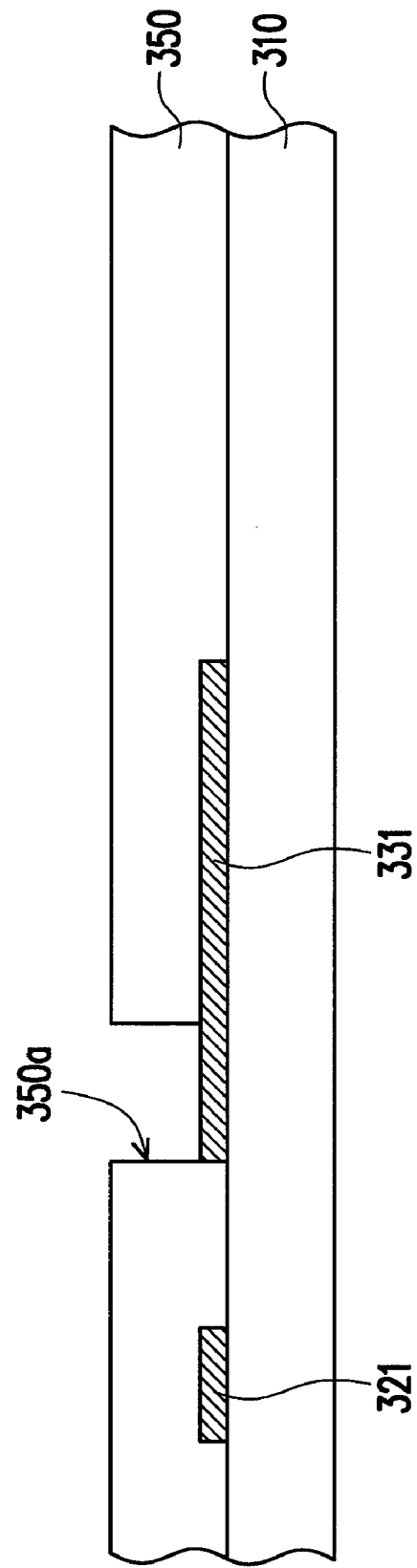

THIN FILM TRANSISTOR AND ORGANIC ELECTRO-LUMINESCENT DISPLAY DEVICE

CROSS-REFERENCE TO RELATED APPLICATION

This application is a divisional of an application Ser. No. 11/309,735, filed on Sep. 19, 2006, now pending, which claims the priority benefit of Taiwan application serial no. 95101041, filed on Jan. 11, 2006. The entirety of each of the above-mentioned patent applications is hereby incorporated by reference herein and made a part of this specification.

BACKGROUND OF THE INVENTION

1. Field of the Invention

The present invention relates to an organic electro-luminescent display (OLED) device and a method of fabricating the same. More particularly, the present invention relates to an organic electro-luminescent display device without a protection layer and a method of fabricating the same.

2. Description of Related Art

Nowadays, the information communication industry has become a mainstream industry, and especially various portable communication display products have been a point of development. As the flat panel display is one of the communication interfaces between human and information device, its development is particularly important. The organic electro-luminescent display (OELD) has great potential due to its advantages of self-luminescence, wide viewing angle, power-saving, simple process, low cost, wide range of operating temperature, high response speed, full colorization, etc.; thus it is expected to be the mainstream of the next-generation flat panel displays.

The OLED is a display using a self-luminescence property of an organic luminescent material to achieve a display effect, and can be classified into one of the two types, namely a small molecule OELD (SM-OELD) and a polymer electro-luminescent device (PELD), according to the molecular weight of the organic luminescent material. The luminescent structure of the above two class includes a pair of electrodes and an organic material layer. When a direct current voltage is applied, electron-holes are injected into the organic luminescent material layer from the anode, and electrons are injected into the organic luminescent material layer from the cathode. Because a potential difference is caused by an applied electric field, the two kinds of carriers, electron-holes and electrons, move and generate radiative recombination in the organic luminescent material layer. A portion of the energy released by the recombination of electrons and electron-holes excites the molecules of the organic luminescent material to form singlet excited state molecules. When the singlet excited state molecules release energy and return to a ground state, a certain proportion of energy is released in a manner of photons to luminescence, which is the luminescence principle of the OLED.

FIG. 1 shows a schematic sectional view of a conventional active matrix OLED. Referring to FIG. 1, a pixel structure 100 of a conventional OLED is controlled by a scan line (not shown) and a data line (not shown) on a substrate 110. The pixel structure 100 mainly includes a switch thin film transistor (switch TFT) 120, a driving thin film transistor (driving TFT) 130, and an organic electro-luminescent unit 140.

Generally, when the pixel structure 100 of the OLED is fabricated, gates 121 and 131 are first formed on the substrate 110. The gates 121 and 131 may comprise, for example, a transparent conductive material, such as indium tin oxide (ITO). Thereafter, a gate insulator 112 is formed on the substrate 110. The gate insulator 112 covers the gates 121 and 131, and has a contact window opening 112a that expose a portion of the gate 131. Then, a source 122 and a drain 123 are formed at predetermined regions on the gate insulator 112 corresponding to the gate 121. Also, a source 132 and a drain 133 are formed at predetermined regions on the gate insulator 112 corresponding to the gate 131. The drain 123 of the switch thin film transistor is electrically connected to the gate 131 of the driving thin film transistor 130 through the contact window opening 112a. Further, a portion of the drain 133 extending rightward is used as an anode 141 of the organic electro-luminescent unit 140.

Thereafter, organic channel layers 124 and 134 are formed. The organic channel layer 124 covers a portion of the source 122 and drain 123, while the organic channel layer 134 covers a portion of the source 132 and drain 133. Further, the organic channel layers 124 and 134 comprise, for example, pentacene. Next, a protection layer 150 is formed on the switch thin film transistor 120 and the driving thin film transistor 130, to protect the switch thin film transistor 120 and the driving thin film transistor 130 from being adversely affected by moisture. The protection layer 150 has a contact window opening 150a corresponding to the anode 141. A luminescent layer 142 is formed in the contact window opening 150a. Thereafter, a metal layer 160 is formed on the protection layer 150 as a cathode 143 of the organic electro-luminescent unit 140. Thus, the fabrication of the pixel structure 100 of the OLED is completed.

However, when an organic material is used to form the above-mentioned protection layer 150, since the organic material can be patterned by a yellow light process, it is difficult to expose the anode 141 of the organic electro-luminescent unit 140. Further, when the organic material is etched to form the contact window opening 150a, the properties of the thin film transistor device are easily degraded.

In addition, since the properties of ordinary organic materials may be easily affected by moisture or atmospheric oxygen, their luminescence properties may be adversely affected. Therefore, when an OLED is packaged, usually an additional layer of hygroscopic material is added in order to prevent the organic material layer from being adversely affected by the moisture or atmospheric oxygen. However, this will increase the complexity of the package process.

SUMMARY OF THE INVENTION

Accordingly, the present invention is directed to provide a thin film transistor and a method of fabricating the same, wherein the possibility of degradation of the device may be effectively reduced.

The present invention is further directed to provide an OLED device and a method of fabricating the same. According to an aspect of the present invention, the locations of a channel layer of the thin film transistor and a luminescent layer of the organic electro-luminescent unit are defined by a plurality of openings in an isolated layer. Thereafter, the channel layer and the luminescent layer are formed in the openings. Therefore, the step of forming a protection layer may be eliminated, and therefore degradation of the device due to the patterning of the protection layer as required in the conventional process may be effectively avoided. Furthermore, the reliability of the device and the service life of the display device may be effectively promoted.

The present invention provides a method of fabricating a thin film transistor. First, a gate is formed on a substrate. A gate insulator is formed on the substrate to cover the gate. A source/drain layer is formed on the gate insulator, and a portion of the gate insulator above the gate is exposed by the source/drain layer. After that, an isolated layer is formed on the source/drain layer, wherein the isolated layer comprises an opening exposing a portion of the gate insulator and a portion of the source/drain layer above the gate. Finally, a channel layer is formed in the opening of the isolated layer and electrically connected to the source/drain layer, and the channel layer is exposed by the opening.

In an embodiment of the present invention, the method for forming the above-mentioned channel layer includes a deposition process using a shadow mask.

In an embodiment of the present invention, the method for forming the above-mentioned channel layer includes an ink-jet printing process.

The present invention further provides a thin film transistor, which mainly includes a substrate, a gate, a gate insulator, a source/drain layer, an isolated layer, and a channel layer. The gate is disposed on the substrate. The gate insulator is disposed on the substrate, and covers the gate. The source/drain layer is disposed on the gate insulator, and exposes a portion of the gate insulator above the gate. The isolated layer is disposed on the source/drain layer, and has an opening to expose a portion of the gate insulator and a portion of the source/drain layer above the gate. The channel layer is disposed in the opening of the isolated layer. Further, the channel layer is exposed by the opening, and is electrically connected to the source/drain layer.

In an embodiment of the present invention, the substrate includes a soft substrate or a hard substrate. The soft substrate includes a plastic substrate or a metal foil. The hard substrate includes a glass substrate, a quartz substrate, or a silicon substrate.

In an embodiment of the present invention, the source/drain layer includes indium tin oxide or indium zinc oxide.

In an embodiment of the present invention, the isolated layer includes an organic material, an inorganic material, or an organic-inorganic composite material.

In an embodiment of the present invention, the organic material includes a polymer material.

In an embodiment of the present invention, the inorganic material includes silicon nitride, silicon oxide, or a hygroscopic material. The hygroscopic material includes alkaline earth oxides.

In an embodiment of the present invention, the channel layer includes an organic semiconductor material or an inorganic semiconductor material.

In an embodiment of the present invention, the organic semiconductor material includes pentacene.

The present invention further provides a method for fabricating an OLED device. First, a first gate and a second gate are formed on a substrate. A gate insulator is formed on the substrate to cover the first gate and the second gate, and the gate insulator has a contact window opening to expose a portion of the second gate. Then, a first source/drain layer, a second source/drain layer, and an anode are formed on the gate insulator, wherein a portion of the first source/drain layer is filled in the contact window opening, such that the first drain layer is electrically connected to the second gate, and the second drain layer is electrically connected to the anode. Thereafter, an isolated layer is formed on the gate insulator, which has a first opening, a second opening, and a third opening, to respectively expose a portion of the gate insulator and a portion of the first source/drain layer above the first gate, a portion of the gate insulator, a portion of the second source/drain layer above the second gate, and a portion of the anode. After that, a first channel layer and a second channel layer are respectively formed in the first opening and the second opening of the isolated layer, wherein the first channel layer and the second channel layer are electrically connected to the first source/drain layer and the second source/drain layer respectively. Finally, a luminescent layer and a cathode are sequentially formed in the third opening of the isolated layer, wherein the luminescent layer covers a portion of the anode, and the cathode covers the luminescent layer.

In an embodiment of the present invention, the step of forming the isolated layer includes forming an isolated layer on the gate insulator and patterning the isolated layer to form the first opening, the second opening, and the third opening.

In an embodiment of the present invention, the method of patterning the isolated layer includes wet etch or dry etch.

In an embodiment of the present invention, the method for forming the first channel layer and the second channel layer includes a deposition process using a shadow mask.

In an embodiment of the present invention, the method for forming the first channel layer and the second channel layer includes an ink-jet printing process.

The present invention further provides an OLED device, adapted to be disposed on a substrate. The display device mainly includes a driving circuit and an organic electro-luminescent unit. The driving circuit includes a switch thin film transistor and a driving thin film transistor, each of which includes a gate, a gate insulator, a source/drain layer, an isolated layer, and a channel layer. The gate is disposed on the substrate. The gate insulator is disposed on the substrate, and covers the gate. The source/drain layer is disposed on the gate insulator, and exposes a portion of the gate insulator above the gate. The isolated layer is disposed on the source/drain layer, and has an opening to expose a portion of the gate insulator and a portion of the source/drain layer above the gate. The channel layer is disposed in the opening of the isolated layer, wherein the channel layer is exposed by the opening, and is electrically connected to the source/drain layer. Further, the source/drain layer of the switch thin film transistor is electrically connected to the gate of the driving thin film transistor. The organic electro-luminescent unit includes an anode, a luminescent layer, and a cathode. The anode is disposed on the substrate, and is electrically connected to the source/drain layer of the driving thin film transistor. The luminescent layer is disposed on the anode. The cathode is disposed on the luminescent layer.

In an embodiment of the present invention, the gate insulator extends to between the substrate and the anode.

In an embodiment of the present invention, the isolated layer extends to the anode, and the isolated layer has another opening to expose a portion of the anode. The luminescent layer is disposed in the other opening of the isolated layer.

In an embodiment of the present invention, a contact window opening is provided in the gate insulator, to expose a portion of the gate of the driving thin film transistor. A portion of the source/drain layer of the switch thin film transistor is filled in the contact window opening, such that the source/drain layer of the switch thin film transistor is electrically connected to the gate of the driving thin film transistor through the contact window opening.

In an embodiment of the present invention, the substrate includes a soft substrate or a hard substrate. The soft substrate includes a plastic substrate or a metal foil. The hard substrate includes a glass substrate, a quartz substrate, or a silicon substrate.

In an embodiment of the present invention, the isolated layer includes an organic material, an inorganic material, or an organic-inorganic composite material.

In an embodiment of the present invention, the organic material includes a polymer material.

In an embodiment of the present invention, the inorganic material includes silicon nitride, silicon oxide, or a hygroscopic material. The hygroscopic material includes alkaline earth oxides.

In an embodiment of the present invention, the channel layer includes an organic semiconductor material or an inorganic semiconductor material.

In an embodiment of the present invention, the organic semiconductor material includes pentacene.

In an embodiment of the present invention, the luminescent layer includes an organic small molecule luminescent material, an organic polymer luminescent material or a luminescent material mixed with organic small molecule and polymer.

In an embodiment of the present invention, the channel layer of the driving thin film transistor is electrically insulated from the cathode of the organic electro-luminescent unit.

In view of the above, the present invention provides a novel method for fabricating an OLED device, in which the fabrication of a protection layer is saved during fabricating the OLED device. Therefore, the degradation of device due to the fabrication and patterning of the protection layer in a conventional OLED device may be avoided, thus the reliability and the service life of the OLED device may be effectively promoted.

In order to the make aforementioned and other features and advantages of the present invention comprehensible, preferred embodiment accompanied with figures are described in detail below.

It is to be understood that both the foregoing general description and the following detailed description are exemplary, and are intended to provide further explanation of the invention as claimed.

BRIEF DESCRIPTION OF THE DRAWINGS

FIGS. 3A to 3F show schematic sectional views of the process steps of fabricating an OLED device according to a preferred embodiment of the present invention.

DESCRIPTION OF EMBODIMENTS

Figure 1:
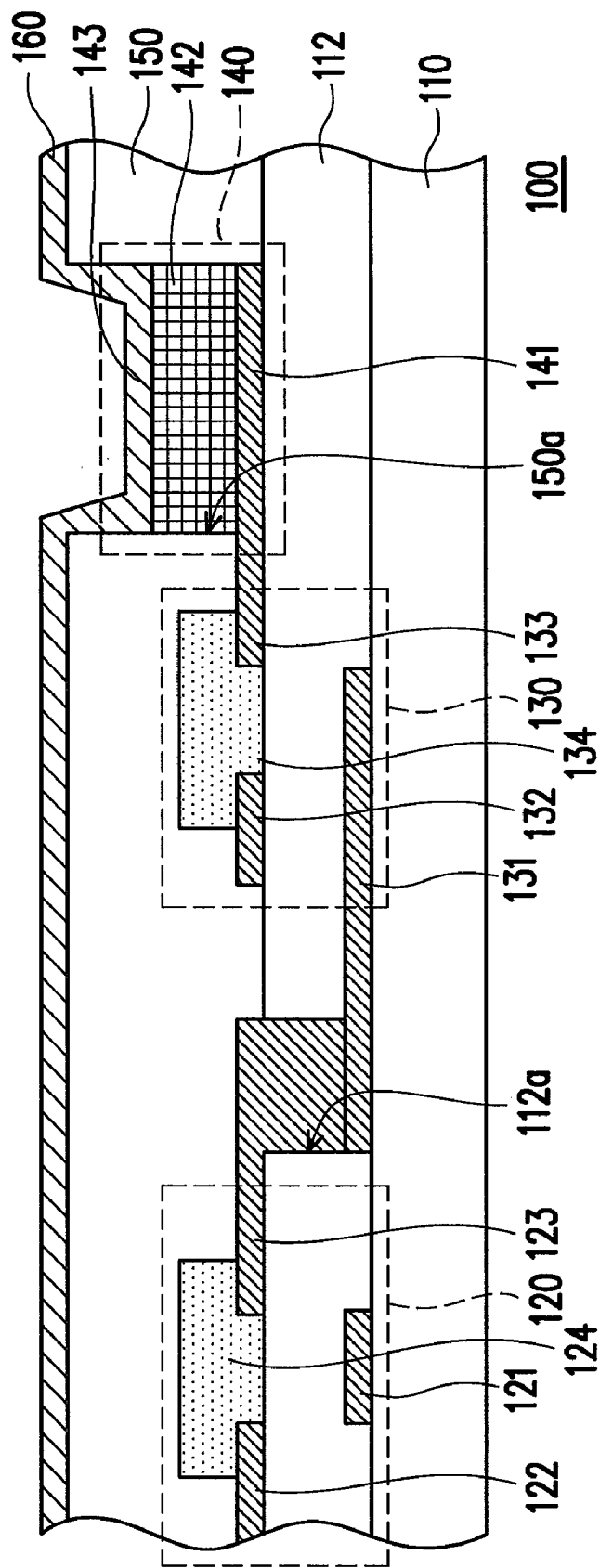
FIG. 1 shows a schematic sectional view of a conventional active matrix OLED.
Figure 2A:
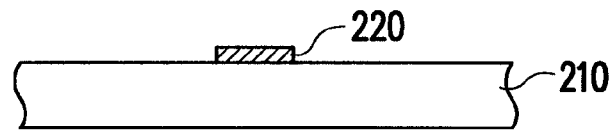
FIGS. 2A to 2E show schematic sectional views of the process steps of fabricating a thin film transistor according to a preferred embodiment of the present invention.

FIGS. 2A to 2E show schematic sectional views of the process steps of fabricating a thin film transistor according to a preferred embodiment of the present invention. Referring to FIG. 2A first, a gate 220 is formed on a substrate 210. In an embodiment of the present invention, the method for forming the gate 220 includes first depositing a conductor layer (not shown) on the substrate 210 and performing a photolithography process and an etching process using a mask (not shown) to pattern the conductor layer, such that the gate 220 is formed on the substrate 210. The photolithography and etching processes are well known semiconductor processes to those skilled in the art, and the detailed description is omitted herein. The substrate 210 is a soft substrate or a hard substrate. The soft substrate includes a plastic substrate or a metal foil. The hard substrate includes a glass substrate, a quartz substrate, or a silicon substrate. In the present invention, the material of the substrate 210 is not limited to any particular material. Further, the gate 220 can be formed of a transparent conductive material such as indium tin oxide (ITO) or indium zinc oxide (IZO).

Figure 2B:
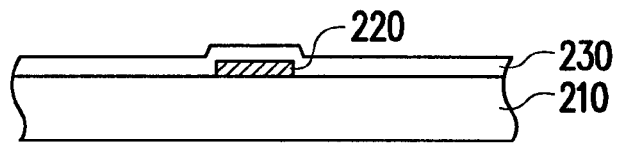

Next, referring to FIG. 2B, a gate insulator 230 is formed on the substrate 210 to cover the gate 220. The method for forming the gate insulator 230 can be physical vapor deposition (PVD) or chemical vapor deposition (CVD). Furthermore, when a silicon wafer is used as the substrate 210, the material of the gate insulator 230 can be silicon nitride or silicon oxide.

Figure 2C:
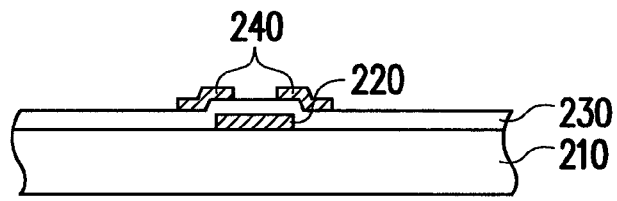

Thereafter, referring to FIG. 2C, a source/drain layer 240 is formed on the gate insulator 230, to expose a portion of the gate insulator 230 above the gate 220. The method for forming the source/drain layer 240 includes, for example, first depositing a conductive material layer (not shown) on the gate insulator and patterning the conductive material layer by a wet etching or dry etching process so as to form the source/drain layer 240 as shown in FIG. 2C. The source/drain layer 240 can be formed of a transparent conductive material such as indium tin oxide (ITO) or indium zinc oxide (IZO).

Generally, in the fabrication of a conventional thin film transistor, after the source/drain layer 240 is formed, a channel layer is directly formed on a portion of the gate insulator above the gate. Next, a protection layer is completely covered thereon, thus the fabrication of a thin film transistor is completed. In contrast, the present invention proposes directly forming an isolated layer on the source/drain layer 240 after the formation of the source/drain layer 240, wherein the isolated layer has an opening defining the location of the channel layer. Next, the channel layer is formed in the opening of the isolated layer. Accordingly, it is not necessary to form a protection layer, and therefore the degradation of device due to the formation and patterning of the protection layer as in a case of the aforementioned conventional thin film transistor may be effectively avoided.

Figure 2D:
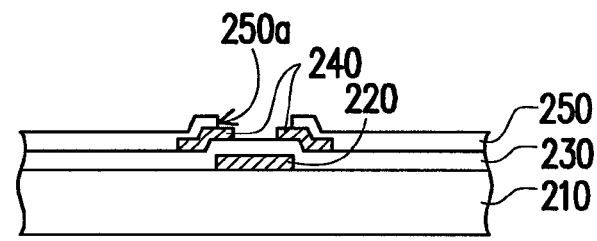

Referring to FIG. 2D, an isolated layer 250 is formed on the source/drain layer 240, wherein the isolated layer 250 comprises an opening 250a that expose a portion of the gate insulator 230 and a portion of the source/drain layer 240 above the gate 220. In an embodiment of the present invention, the isolated layer 250 can be comprised of an organic material, an inorganic material, or an organic-inorganic composite material. Further, the organic material comprises a polymer material, e.g. photoresist. The inorganic material includes silicon nitride, silicon oxide, or a hygroscopic material. In this step, if the hygroscopic material is used as the material of the isolated layer 250, it not only provides the insulation effect but also effectively protects the organic material layer from moisture and oxygen. Therefore, the reliability and the service life of a thin film transistor may be effectively promoted. Generally, the hygroscopic material includes alkaline earth oxides, such as calcium oxide and magnesium oxide.

Figure 2E:
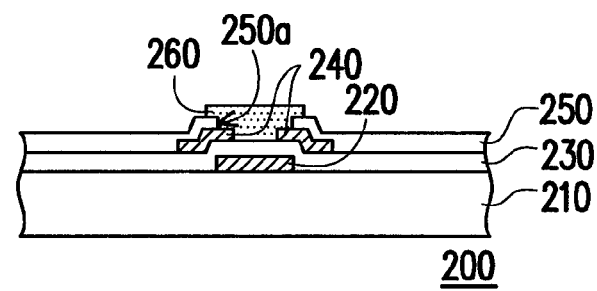

Finally, referring to FIG. 2E, a channel layer 260 is formed in the opening 250a of the isolated layer 250 so that the channel layer 260 is electrically connected to the source/drain layer 240 and is exposed by the opening 250a. The method for forming the channel layer 260 may include a deposition process using a shadow mask, or an ink-jet printing process for jetting the material of the channel layer 260 into the opening 250a. Thus, the fabrication of the thin film transistor 200 is completed. In an embodiment of the present invention, the channel layer 260 may comprise an organic semiconductor material or an inorganic semiconductor material, and the thin film transistor 200 accordingly formed is an organic thin film transistor or an inorganic thin film transistor. Further, the organic semiconductor material frequently used in the organic thin film transistor is pentacene.

Hereinafter, the thin film transistor fabricated according to the above processes of the present invention will be illustrated in details.

Referring to FIG. 2E, a thin film transistor 200 includes a substrate 210, a gate 220, a gate insulator 230, a source/drain layer 240, an isolated layer 250, and a channel layer 260. The gate 220 is disposed on the substrate 210. The gate insulator 230 is disposed on the substrate 210, and covers the gate 220. The source/drain layer 240 is disposed on the gate insulator 230, and exposes a portion of the gate insulator 230 above the gate 220. The present invention proposes directly forming the isolated layer 250 on the source/drain layer 240, wherein the isolated layer 250 comprises an opening 250a that expose a portion of the gate insulator 230 and a portion of the source/drain layer 240 above the gate 220 to define the location of the channel layer 260. The channel layer 260 is disposed in the opening 250a of the isolated layer 250 and is exposed by the opening 250a. The channel layer 260 is electrically connected to the source/drain layer 240.

Since a step of fabricating a protection layer can be omitted in the above-mentioned method of fabricating a thin film transistor, the degradation of device due to the fabrication and patterning of the protection layer as in the case of the conventional thin film transistor may be effectively avoided. Hereinafter, the application of the process of fabricating the OLED device of the thin film transistor will be illustrated in combination with appended drawings.

Figure 3C:
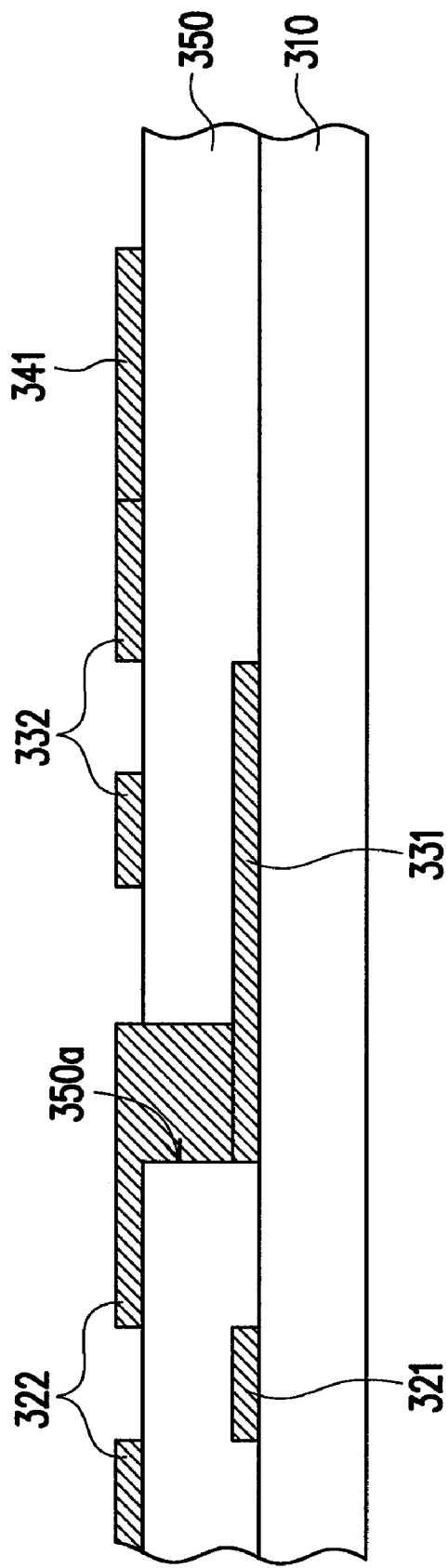

FIGS. 3A to 3F show schematic sectional views of the process steps of fabrication of an OLED device according to a preferred embodiment of the present invention. Referring to FIG. 3A, a first gate 321 and a second gate 331 are formed on a substrate 310. The substrate 310 is a soft substrate or a hard substrate. The soft substrate includes a plastic substrate or a metal foil. The hard substrate includes a glass substrate, a quartz substrate, or a silicon substrate. In the present invention, the material of the substrate 310 is not limited to any particular material. The method of fabricating the first gate 321 and the second gate 331 includes depositing a transparent conductive layer on the substrate 310 and performing a photolithographic process and an etching process to form the first gate 321 and the second gate 331. In an embodiment of the present invention, the first gate 321 and the second gate includes a transparent conductive material such as indium tin oxide (ITO) or indium zinc oxide (IZO).

Thereafter, referring to FIG. 3B, a gate insulator 350 is formed on the substrate 310 to cover the first gate 321 and the second gate 331. The gate insulator 350 has a contact window opening 350a that expose a portion of the second gate 331. In an embodiment of the present invention, the gate insulator 350 may be formed by using a physical vapor deposition or chemical vapor deposition process. The isolated layer includes silicon nitride, silicon oxide, or other insulating materials. Next, a photolithographic process and an etching process may be carried out to form the contact window opening 350a in the gate insulator 350 to expose a portion of the second gate 331.

Next, referring to FIG. 3C, a first source/drain layer 322, a second source/drain layer 332, and an anode 341 are formed on the gate insulator 350. A portion of the first source/drain layer 322 is filled in the contact window opening 350a so that the drain in the first source/drain layer 322 is electrically connected to the second gate 331, and the drain in the second source/drain layer 332 is electrically connected to the anode 341. In a preferred embodiment of the present invention, since the process of forming the first source/drain layer 322, the second source/drain layer 332, and the anode 341 is similar or identical the process for forming the source/drain layer 240 in the thin film transistor 200, and therefore will not be described herein.

Figure 3D:
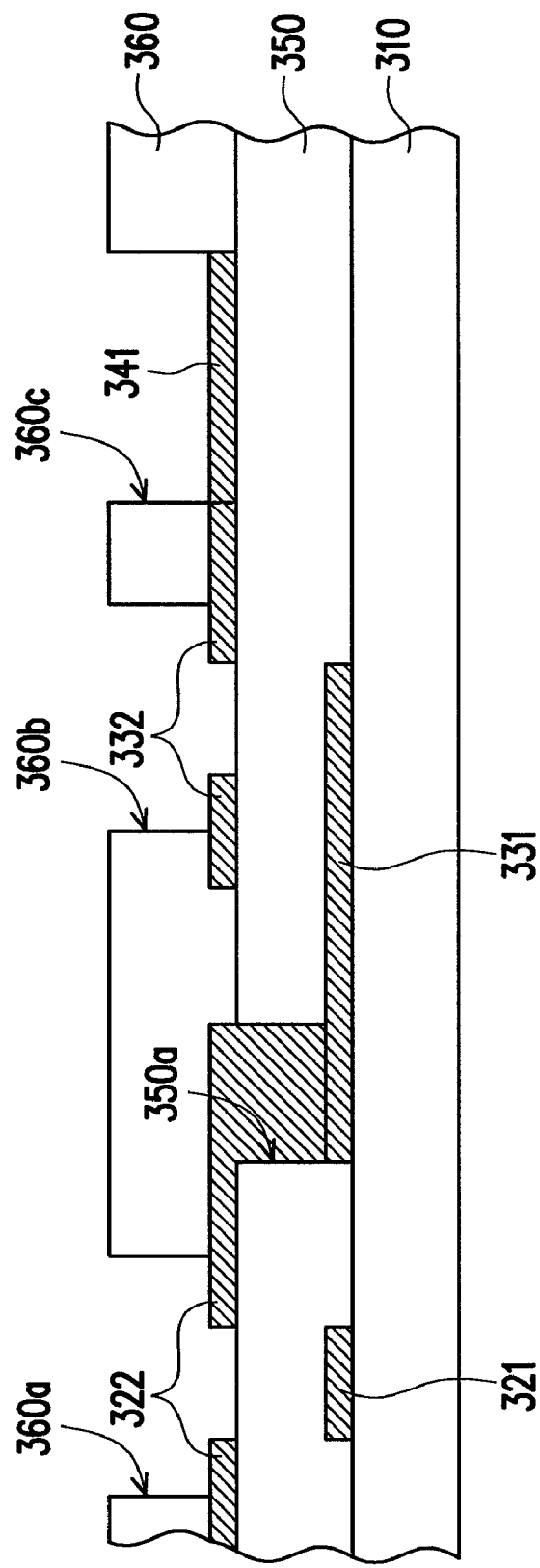

Thereafter, referring to FIG. 3D, an isolated layer 360 is formed on the gate insulator 350, wherein the isolated layer 360 comprises a first opening 360a, a second opening 360b and a third opening 360c respectively exposing a portion of the gate insulator 350 and a portion of the first source/drain layer 322 above the first gate 321, a portion of the gate insulator 350, and a portion of the second source/drain layer 332 above the second gate 331, and a portion of the anode 341. In this step, first, an isolated layer is formed on the gate insulator 350. Next, the isolated layer is patterned by the wet etching or dry etching to form the first opening 360a, the second opening 360b, and the third opening 360c. The isolated layer 360 includes an organic material, an inorganic material, or an organic-inorganic composite material. The organic material includes a polymer material, e.g. photoresist. The inorganic material includes silicon nitride, silicon oxide, or a hygroscopic material. In this step, if the isolated layer 360 comprises a hygroscopic material, it not only provides the insulation effect but also protects the subsequently formed organic semiconductor layer from moisture and oxygen. Thus, the reliability and the service life of the OLED device may be effectively promoted. Generally, the hygroscopic material includes alkaline earth oxides, such as calcium oxide, magnesium oxide.

Figure 3E:
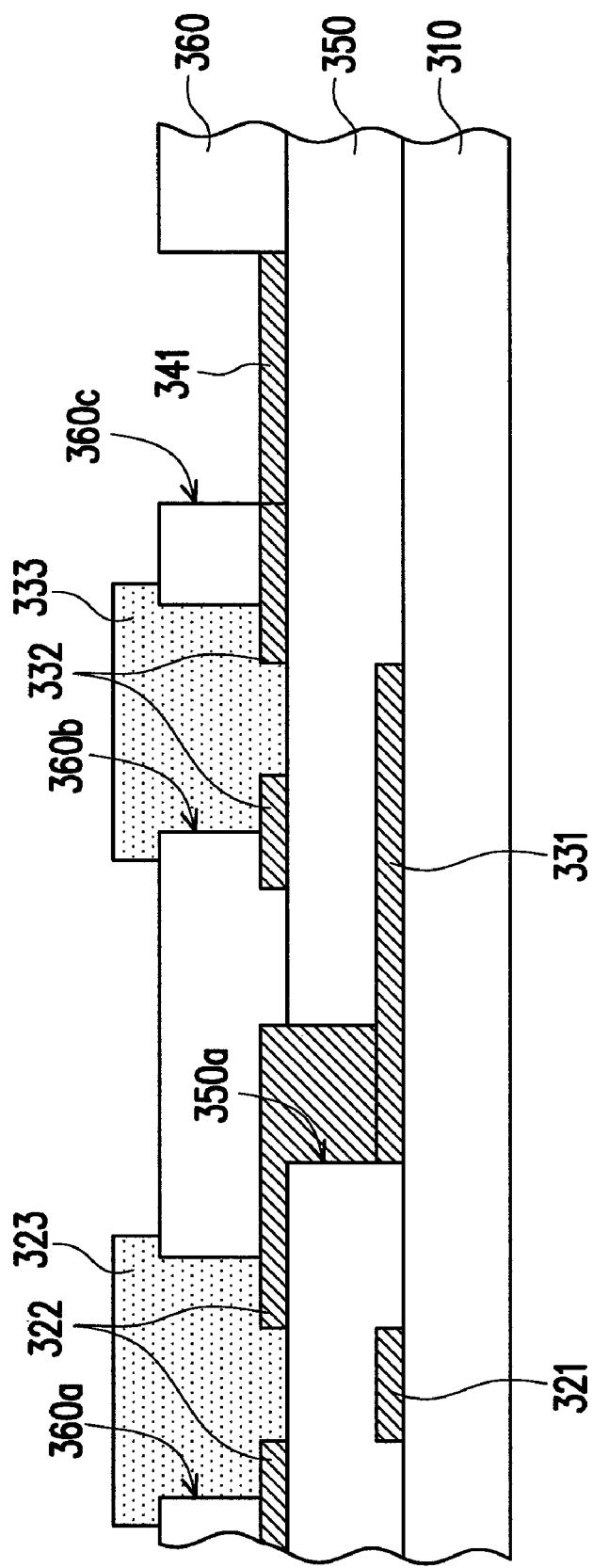

Next, referring to FIG. 3E, a first channel layer 323 and a second channel layer 333 are respectively formed in the first opening 360a and the second opening 360b of the isolated layer 360. The first channel layer 323 and the second channel layer 333 are electrically connected to the first source/drain layer 322 and the second source/drain layer 332 respectively. The method for forming the first channel layer 323 and the second channel layer 333 includes deposition process using a shadow mask or an ink-jet printing process for jetting the semiconductor material into the first opening 360a and the second opening 360b to form the first channel layer 323 and the second channel layer 333. In an embodiment of the present invention, the first channel layer 323 and the second channel layer 333 comprise an organic semiconductor material or an inorganic semiconductor material, and the thin film transistor accordingly formed is an organic thin film transistor or an inorganic thin film transistor respectively. The organic semiconductor material frequently used in the organic thin film transistor is pentacene.

Figure 3F:
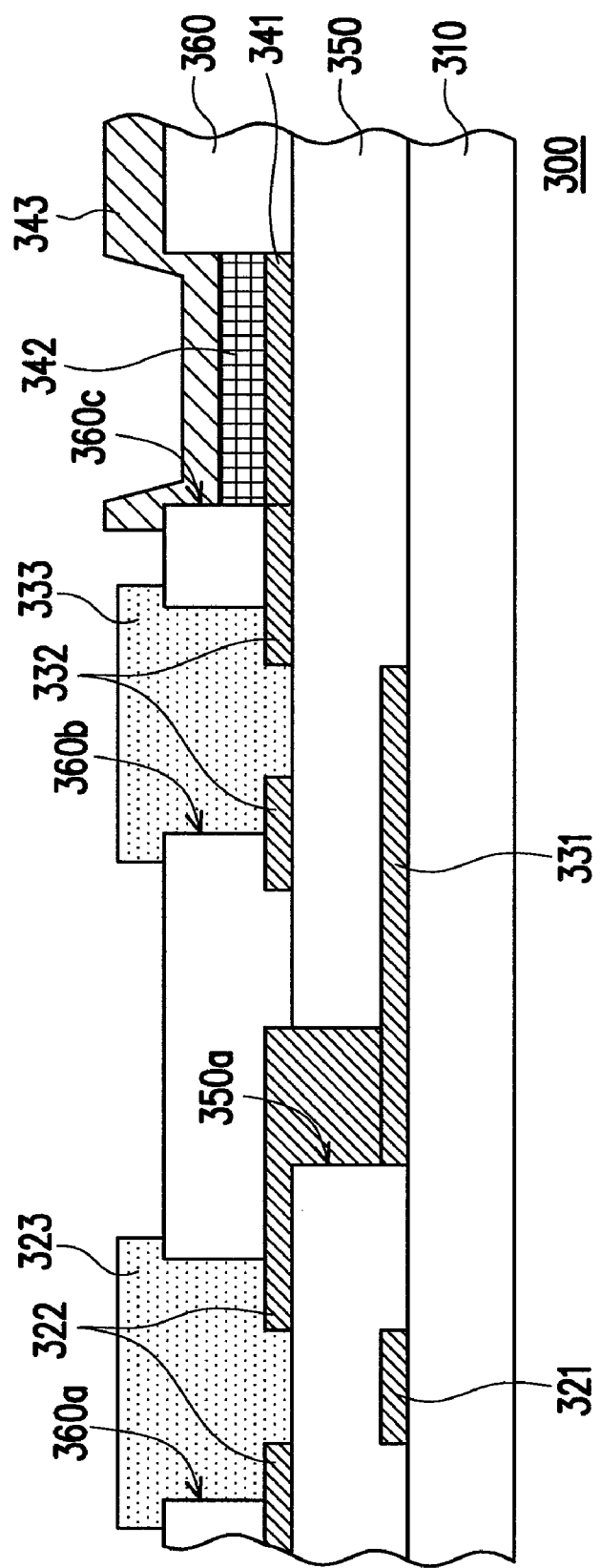

Finally, referring to FIG. 3F, a luminescent layer 342 and a cathode 343 are sequentially formed in the third opening 360c of the isolated layer 360. The luminescent layer 342 covers a portion of the anode 341. The cathode 343 covers the luminescent layer 342. In an embodiment of the present invention, the luminescent layer 342 comprises small molecule organic luminescent material, an organic polymer luminescent material, or combinations thereof. Thus, the fabrication of the OLED device 300 is completed.

Figure 4:
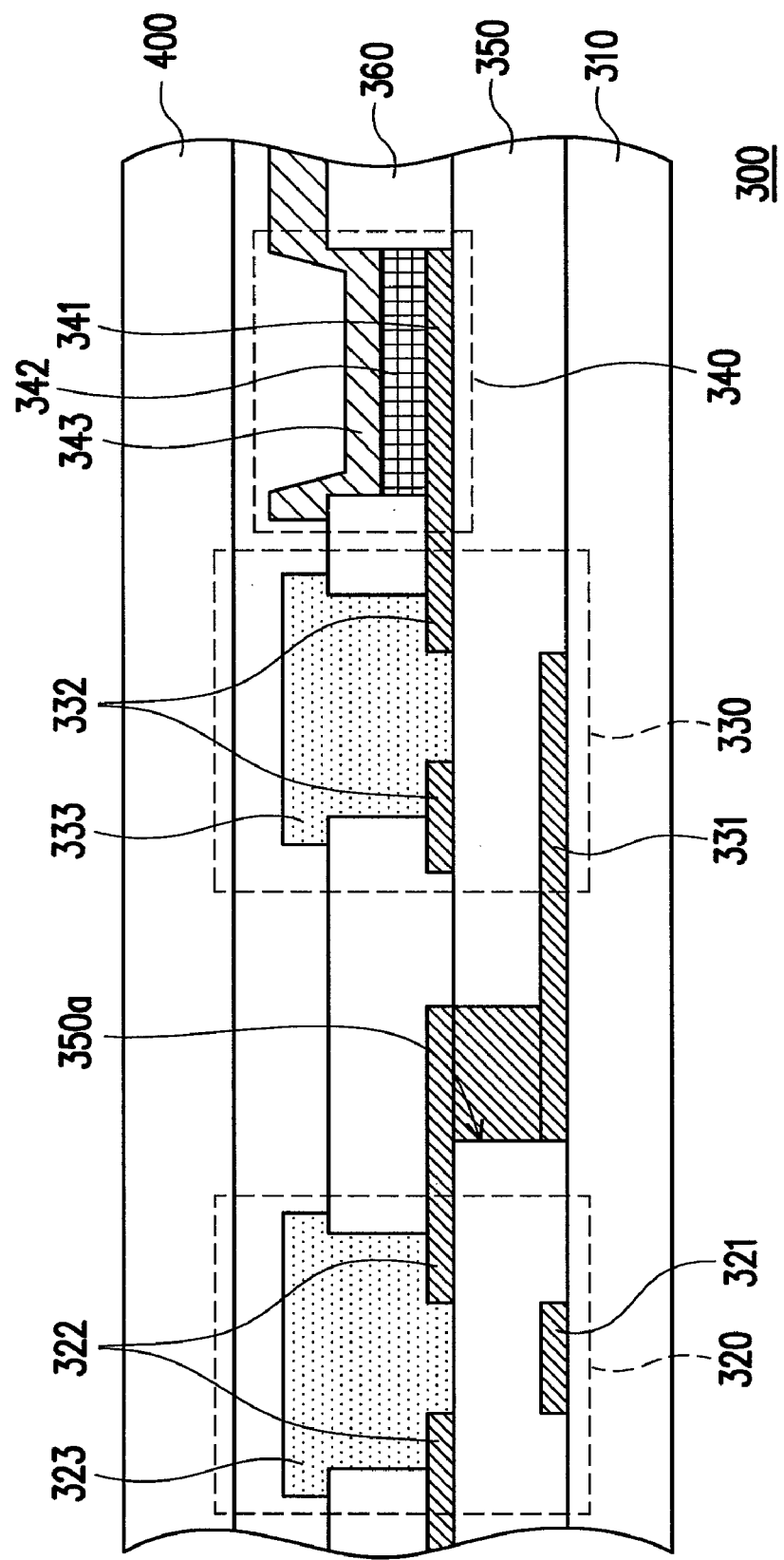
FIG. 4 shows a schematic sectional view of an OLED device of the present invention after it is integrated with a packaging substrate.

FIG. 4 shows a schematic sectional view of an OLED device fabricated according to the above process after being combined with a packaging substrate. Referring to FIG. 4, the OLED device 300 of the present invention mainly includes a driving circuit and an organic electro-luminescent unit 340. The organic electro-luminescent unit 340 luminesces through being driven by the driving circuit.

The driving circuit comprises a switch thin film transistor 320 and a driving thin film transistor 330 electrically connected thereto. The switch thin film transistor 320 includes a first gate 321, a gate insulator 350, a first source/drain layer 322, an isolated layer 360, and a first channel layer 323. The first gate 321 is disposed on the substrate 310. The gate insulator 350 is disposed on the substrate 310, and covers the first gate 321. The first source/drain layer 322 is disposed on the gate insulator 350, and exposes a portion of the gate insulator 350 above the first gate 321. The isolated layer 360 is disposed on the first source/drain layer 322, and has a first opening 360a that expose a portion of the gate insulator 350 and a portion of the first source/drain layer 322 above the first gate 321. The first channel layer 323 is disposed in the first opening 360a of the isolated layer 360. Further, the first channel layer 323 is exposed by the first opening 360a, and is electrically connected to the first source/drain layer 322. Since the structure of the driving thin film transistor 330 is approximately the same as that of the switch thin film transistor 320, the description thereof will not be repeated herein. The first source/drain layer 322 of the switch thin film transistor 320 is electrically connected to the second gate 331 in the driving thin film transistor 330 through the contact window opening 350a in the gate insulator 350. Further, the switch thin film transistor 320 and the driving thin film transistor 330 includes, for example but not limited to, an organic thin film transistor or an inorganic thin film transistor.

The organic electro-luminescent unit 340 mainly comprises an anode 341, a luminescent layer 342 and a cathode 343. The anode 341 is electrically connected to the second gate 331 of the driving thin film transistor 330 to provide the current to the driving thin film transistor 330 for driving the organic electro-luminescent unit 340. The luminescent layer 342 is formed in the third opening 360c of the isolated layer 360, and is located on the anode 341. The luminescent layer 342 comprises small molecule organic luminescent material, organic polymer luminescent material, or combinations thereof. In the present invention, the material of the luminescent layer 342 is not limited to any particular material. It should be noted that, the cathode 343 is located on the luminescent layer 342, and is electrically insulated from the second channel layer 333 of the driving thin film transistor 330.

After the fabrication of the OLED device 300 according to the above process is completed, it is integrated into a packaging substrate 400.

In summary, the present invention provides a novel method for fabricating an OLED device. The locations of the channel layer of the thin film transistor and the luminescent layer of the organic electro-luminescent unit are defined by an isolated layer, and the fabrication of a protection layer on the isolated layer is unnecessary. Therefore, the degradation of device due to the fabrication and patterning of the protection layer as in the case of the conventional OLED device may be avoided, thus the reliability and the service life of the OLED device may be effectively promoted.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An OLED device, adapted to be disposed on a substrate, comprising:
   a driving circuit, including a switch thin film transistor and a driving thin film transistor, wherein the switch thin film transistor and the driving thin film transistor respectively comprise:
   a gate, disposed on the substrate;
   a gate insulator, disposed on the substrate and covering the gate;
   a source/drain layer, disposed on the gate insulator, exposing a portion of the gate insulator above the gate;
   an isolated layer, disposed on the source/drain layer, having an opening that exposes a portion of the gate insulator and a portion of the source/drain layer above the gate; and
   a channel layer, disposed in the opening of the isolated layer, wherein the channel layer is protruded above the opening to cover the isolated layer and is electrically connected to the source/drain layer,
   wherein the source/drain layer of the switch thin film transistor is electrically connected to the gate of the driving thin film transistor;
   an organic electro-luminescent unit, comprising:
   an anode, disposed on the substrate, and is electrically connected to the source/drain layer of the driving thin film transistor;
   a luminescent layer, disposed on the anode;
   a cathode, disposed on the luminescent layer; and
   a packaging substrate covering the channel layers of the switch thin film transistor and the driving thin film transistor, the luminescent layer, and the cathode.

2. The OLED device as claimed in claim 1, wherein the gate insulator extends between the substrate and the anode.

3. The OLED device as claimed in claim 1, wherein the isolated layer extends to the anode, and has another opening to expose a portion of the anode.

4. The OLED device as claimed in claim 3, wherein the luminescent layer is disposed in the another opening of the isolated layer.

5. The OLED device as claimed in claim 1, wherein the gate insulator is provided with a contact window opening to expose a portion of the gate of the driving thin film transistor, and a portion of the source/drain layer of the switch thin film transistor is filled in the contact window opening, such that the source/drain layer of the switch thin film transistor is electrically connected to the gate of the driving thin film transistor through the contact window opening.

6. The OLED device as claimed in claim 1, wherein the substrate comprises a soft substrate or a hard substrate.

7. The OLED device as claimed in claim 6, wherein the soft substrate comprises a plastic substrate or a metal foil.

8. The OLED device as claimed in claim 6, wherein the hard substrate comprises a glass substrate, a quartz substrate, or a silicon substrate.

9. The OLED device as claimed in claim 1, wherein a material of the isolated layer comprises an organic material, an inorganic material, or an organic-inorganic composite material.

10. The OLED device as claimed in claim 9, wherein the organic material comprises a polymer material.

11. The OLED device as claimed in claim 9, wherein the inorganic material comprises silicon nitride, silicon oxide, or a hygroscopic material.

12. The OLED device as claimed in claim 11, wherein the hygroscopic material comprises alkaline earth oxides.

13. The OLED device as claimed in claim 1, wherein a material of the channel layer comprises an organic semiconductor material or an inorganic semiconductor material.

14. The OLED device as claimed in claim 13, wherein the organic semiconductor material comprises pentacene.

15. The OLED device as claimed in claim 1, wherein a material of the luminescent layer comprises small molecule organic luminescent material, an organic polymer luminescent material, or combinations thereof.

16. The OLED device as claimed in claim 1, wherein the channel layer of the driving thin film transistor is electrically insulated from the cathode of the organic electro-luminescent unit.

* * * * *